(12) United States Patent
Wu et al.

(10) Patent No.: US 7,816,988 B2
(45) Date of Patent: Oct. 19, 2010

(54) AMPLIFIER

(76) Inventors: Honglei Wu, c/o National University of Singapore, Department of Electrical and Computer Engineering, 10 Kent Ridge Crescent, Singapore (SG) 119260;
Yong-Ping Xu, c/o National University of Singapore, Department of Electrical and Computer Engineering, 10 Kent Ridge Crescent, Singapore (SG) 119260

( * ) Notice: Subject to any disclaimer, the term of this patent is extended or adjusted under 35 U.S.C. 154(b) by 355 days.

(21) Appl. No.: 11/703,546

(22) Filed: Feb. 5, 2007

(65) Prior Publication Data
US 2007/0222517 A1    Sep. 27, 2007

Related U.S. Application Data

(60) Provisional application No. 60/765,057, filed on Feb. 3, 2006.

(51) Int. Cl.
 *H03F 3/45* (2006.01)
(52) U.S. Cl. ......................... 330/253; 330/149; 330/260
(58) Field of Classification Search ................. 330/253, 330/149, 260
See application file for complete search history.

(56) References Cited

U.S. PATENT DOCUMENTS

| | | | | |
|---|---|---|---|---|
| 4,519,401 A * | 5/1985 | Ko et al. | ...................... | 600/561 |
| 5,272,481 A * | 12/1993 | Sauer | ........................ | 341/165 |
| 6,118,400 A * | 9/2000 | Susak | ........................ | 341/172 |
| 6,124,818 A * | 9/2000 | Thomas et al. | ............... | 341/155 |
| 6,300,669 B1 * | 10/2001 | Kinoshita | .................... | 257/566 |
| 6,307,430 B1 * | 10/2001 | Thomsen et al. | ................ | 330/9 |
| 6,480,042 B2 * | 11/2002 | Kadowaki | .................... | 327/103 |
| 6,831,690 B1 * | 12/2004 | John et al. | ................... | 348/302 |
| 6,850,753 B2 * | 2/2005 | Zhang et al. | ................. | 455/341 |
| 6,909,327 B2 * | 6/2005 | Horimoto | .................... | 330/253 |
| 6,973,182 B1 * | 12/2005 | Aude | ..................... | 379/399.01 |
| 7,068,319 B2 * | 6/2006 | Barna et al. | .................. | 348/372 |
| 7,071,778 B2 * | 7/2006 | Butler | ......................... | 330/253 |
| 7,126,403 B2 * | 10/2006 | Kenney et al. | ............... | 327/291 |
| 7,215,198 B1 * | 5/2007 | Dasgupta | ..................... | 330/256 |
| 7,250,896 B1 * | 7/2007 | Hesener et al. | .............. | 341/163 |
| 7,256,725 B2 * | 8/2007 | Mulder | ........................ | 341/172 |
| 7,324,035 B2 * | 1/2008 | Harris et al. | .................. | 341/155 |
| 7,405,689 B2 * | 7/2008 | Kernahan et al. | ........... | 341/156 |
| 7,427,738 B2 * | 9/2008 | Sugimoto | ................ | 250/214 A |
| 2003/0155966 A1 * | 8/2003 | Harrison | ......................... | 330/9 |
| 2008/0030271 A1 * | 2/2008 | Aoyama et al. | .............. | 330/252 |

OTHER PUBLICATIONS

Honglei Wu and Yong-Ping Xu, A Low Voltage Low Noise CMOS Instrumentation Amplifier for Portable Medical Monitoring Systems, IEEE-NEWCAS Conference, ISBN: 0-7803-8934-4, pp. 295-298, Aug. 22, 2005.*

(Continued)

*Primary Examiner*—Patricia Nguyen
(74) *Attorney, Agent, or Firm*—Schwabe, Williamson & Wyatt, P.C.

(57) ABSTRACT

An apparatus having means for amplifying a differential voltage signal. The means for amplifying includes at least an input stage and an output stage. The output stage includes means for preventing a trade off between a reduction in noise of an output voltage signal and an increase in a dynamic range of the output voltage signal.

17 Claims, 8 Drawing Sheets

OTHER PUBLICATIONS

Honglei Wu and Yong-Ping Xu, A 1 V 2.3 mW Biomedical Signal Acquisition IC, IEEE-ISSCC (International Solid State Circuits Conference—Session 2—Biomedical Systems—2.7), Digest of Technical Papers, Feb. 6, 2006.*

Jeremy Holleman and Brian Otis, A Sub-Microwatt Low Noise Amplifier for Neural Recording, Proceeding of the 29th Annual International Conference of the IEEE EMBS, Aug. 23-26, 2007.*

Jannik H. Nielsen and Erik Bruun, A Low Power 10-Bit Continuous Time CMOS Sigma Delta A/D Converter, IEEE ISCAS, 2004.*

R.R. Harrison et al., A Low-Power Low-Noise CMOS Amplifier for Neural Recording Applications, IEEE J. Solid State Circuits, vol. 38, No. 6, pp. 958-965, Jun. 2003.

R. Martins et al., A CMOS IC for Portable EEG Acquisition Systems, IEEE Transactions on Instrumentation and Measurement, vol. 47, No. 5, Oct. 1998, pp. 1191-1196.

Y Hu et al., CMOS Front-end Amplifier Dedicated to Monitor Very Low Amplitude Signal from Implantable Sensors, Proc. 43rd IEEE Midwest Symp. On Circuits and Systems, Lansing MI, Aug. 11, 2000, pp. 298-301.

A. Uranga et al., A Low Noise CMOS Amplifier for Eng Signals, IEEE, ISCAS 2004, pp. IV-21-IV-24.

M. S. J. Steyaert et al., A Micropower Low-Noise Monolithic Instrumentation Amplifier for Medical Purposes, IEEE Journal of Solid-State Circuits, vol. sc-22, No. 6, Dec. 1987, pp. 1163-1168.

* cited by examiner

-Prior Art-

AMPLIFIER

RELATED APPLICATION

This patent application claims priority to U.S. provisional patent application Ser. No. 60/765,057, filed Feb. 3, 2006.

BACKGROUND

The present disclosure relates, in general, to amplifiers and similar electronic circuits. Portability is a desirable feature for a variety of electronic devices, including, for example, medical devices. Challenges exist in making electronic devices, such as amplifiers, for example, sufficiently small. One challenge relates to reducing power consumption since reduced power consumption may also reduce the size of a battery or similar power source to power the device. Likewise, a further challenge relates to noise reduction. At times, reducing power consumption may have an undesirable consequence in that signal quality may be reduced through increase noise.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
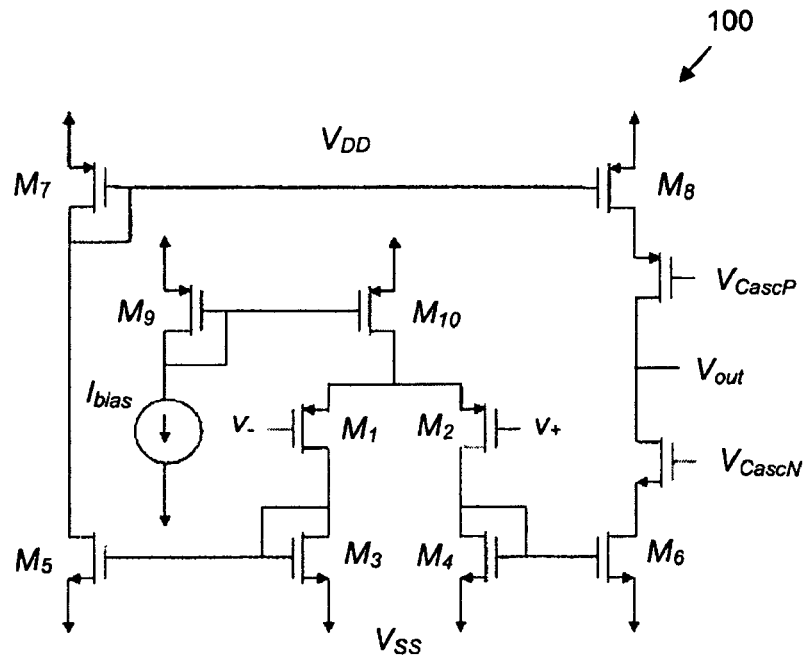
FIG. 1 is a schematic diagram of a typical amplifier.

In the following detailed description, numerous specific details are set forth to provide a thorough understanding of claimed subject matter. However, it will be understood by those skilled in the art that claimed subject matter may be practiced without these specific details. In other instances, well-known methods, procedures and/or other aspects have not been described in detail so as not to obscure claimed subject matter.

For example, medical devices for measuring electrocardiogram (ECG) or electroencephalogram (EEG) may be large and/or clumsy. For patients in which constant or regular ECG monitoring is desired, these medical devices may result in discomfort and/or inconvenience. Low-voltage low-power circuits may be employed for ECG and EEG devices. Thus, a potential exist for coin-sized devices to allow monitoring, while reducing discomfort and/or inconvenience for patients, for example.

Since batteries or other power sources may constitute a large portion of overall volume and/or weight of these devices, it may be desirable to reduce power consumption to prolong the life of the power source employed. Likewise, it may be desirable for these devices to operate with a lightweight and/or low-volume power source. Supply voltage and/or supply current, for example, may be reduced through the use of low-voltage, low-power circuits. However, in some medical applications, as one example, it may likewise be desirable to reduce noise or otherwise achieve low input referred noise to improve the quality of the signal.

Due at least in part to trade-offs between voltage headroom, current consumption and/or noise performance, achieving low-voltage, low-power, and/or low-noise performance in a single device or in a set of interoperating devices may be challenging. Typically, therefore, power consumption and noise performance are traded-off in a particular application. Noise efficiency factor (NEF), for example, which is a quantitative metric to measure the effectiveness of the trade off between current consumption and noise performance, has been proposed. In this particular context, NEF is defined as:

$$NEF = V_{ni,rms} \sqrt{\frac{2 I_{total}}{\pi \cdot U_T \cdot 4\kappa T \cdot BW}} \qquad (1)$$

where $V_{ni,rms}$ is the rms value of input-referred noise, $I_{total}$ is the current consumption and BW is the bandwidth in Hz.

This measure is constructed so that for an "ideal" bipolar single-transistor amplifier in the absence of 1/f noise, NEF is 1. Thus, practical amplifiers have an NEF higher than 1. A lower NEF value is intended to indicate a better trade-off between current consumption and noise. It has been shown that for a CMOS chip through careful design an NEF of about 4.0 may be possible. See, for example, R. R. Harrison, C. Charles "A Low-Power Low-Noise CMOS Amplifier for Neural Recording Applications," IEEE J. Solid State Circuits, vol. 38, no. 6, pp 958-965, June, 2003. This was achieved by carefully choosing transistor parameters. However, in the example, a supply voltage of about 5.0 V was employed.

For a device designed to achieve low NEF, unfortunately, the noise contribution from the input transistors may be dominant. FIG. 1, for example, is a schematic diagram of a typical amplifier, here an operational transconductance amplifier (OTA) with a differential input stage, referred to as amplifier 100. It may be demonstrated that input-referred noise of 100 is:

$$\overline{V_{ni,thermal}^2} = \left[\frac{16kT}{3g_{m1}}\left(1 + 2\frac{g_{m3}}{g_{m1}} + \frac{g_{m7}}{g_{m1}}\right)\right]\Delta f \quad (2)$$

Using relationship (2), one may infer that for a reduction in noise, transconductance of output transistors M3-M7 ($g_{m3\text{-}7}$) should be smaller than transconductance of input transistor M1 ($g_{m1}$). At a given bias current, aspect ratio (W/L) of the output transistors (M3-M7) may be reduced and aspect ratio (W/L) of the input transistors (M1 and M2) may be increased. However, choosing low aspect ratios for output transistors (M3-M7) may lead to a relatively high overdrive voltage ($V_{GS}$-$V_{th}$) and a relatively high $V_{Dsat}$. At the output stage, a large portion of the voltage headroom may as a result be used to accommodate a high $V_{Dsat}$, which may detrimentally impact the ability of the output voltage to swing from rail-to-rail. Although increasing $g_{m1}$, at a given bias current, should also reduce noise, typically $g_{m1}$ cannot be arbitrarily increased. Thus, a trade-off between noise and voltage headroom typically results at the output stage of an amplifier.

Figure 2:
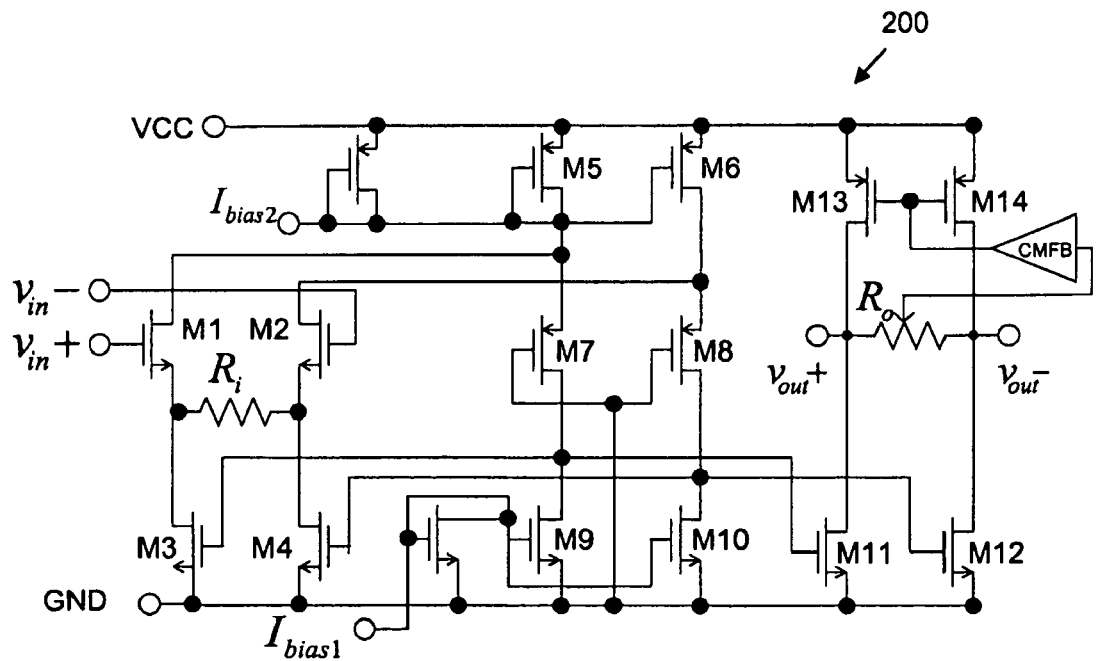
FIG. 2 is a schematic diagram of an embodiment of an amplifier, such as an amplifier in accordance with claimed subject matter.

However, FIG. 2 shows a schematic diagram of an embodiment of an amplifier, here, amplifier 200. Although claimed subject matter is not limited in scope in this respect, amplifier 200 may be employed to provide a relatively low-noise signal while employing relatively low power. In FIG. 2, transistors M1-M12 form a relatively low voltage $g_m$ cell, as explained in more detail below. There are two bias current sources provided off-chip, here $I_{bias1}$ and $I_{bias2}$. In the cell, M1 and M2 are NMOS transistors having sufficiently similar characteristics to cooperate to form a voltage follower with a resistor joining the sources of M1 and M2. Thus, input voltage $V_{in}$, comprising ($V_{in}+$, $V_{in}-$) is applied to $R_i$. The resultant current flowing through $R_i$ is:

$$i_{R_i} = v_{in}/R_i \quad (3)$$

For the embodiment shown in FIG. 2, transistors M1-M1 form a series-shunt feedback loop to adjust gate voltages of M3 and M4 so that electric currents passing through transistors M3, M1, M4 and resistor $R_i$ may be described as follows:

$$i_3 = i_1 - i_{R_i} \quad (4)$$

and $$i_4 = i_1 + i_{R_i} \quad (5)$$

In FIG. 2, M3, M4, M11 and M12 have sufficiently similar size for appropriate mirroring. Drain currents of M3 and M4 are applied to M11 and M12 as a result. The transconductance of the cell of this embodiment, therefore, may be described by the following relationship:

$$g_{m,cell} = (i_{12} - i_{11})/v_{in} = (i_4 - i_3)/v_{in} = 2/R_i \quad (6)$$

M13 and M14 in this particular embodiment comprise a common-mode load for M11 and M12. Likewise, the gate voltage of these former transistors, in this embodiment, may be affected by a common-mode feedback (CMFB) circuit, illustrated in FIG. 2 and described in more detail hereinafter.

Differential current flowing through $R_o$ is ($i_{12} - i_{11}$)/2 and voltage gain of the cell for this particular embodiment may be described by the following relationship:

$$A_v = v_{out}/v_{in} = \frac{(i_{12} - i_{11}) \cdot R_{out}}{2 \cdot v_{in}} = R_{out}/R_i \quad (7)$$

Although claimed subject matter is not limited in scope in this respect, a common-mode feedback circuit for this particular embodiment may operate as follows. Such a circuit may have a configuration, one example being illustrated in FIG. 2, so that it senses an average of a differential output voltage or a common-mode voltage change at the center of $R_O$. Likewise, as illustrated, an output signal of a common-mode feedback circuit is applied to the gates of M13 and M14 and, therefore, may affect their operation. Likewise, the drains of these transistors are employed in this particular embodiment, here, so as to adjust a common-mode output voltage of the amplifier.

For this particular embodiment, as illustrated, M5 and M6 provide bias currents for M1 and M2, and M7 and M8, respectively. M1 and M2, and M7 and M8 form a differential cascode configuration with M9 and M10 as the load. A cascode configuration here operates to provide high gain for the feedback loop of this particular embodiment. Likewise, the output signal of this cascode configuration is fed back through M3 and M4.

A common mode input voltage range for this particular embodiment may be described by the following relationship:

$$V_{dsat3} + V_{thn} + V_{dsat1} < V_{common} < V_{cc} - V_{dsat5} + V_{thn} \quad (8)$$

A differential input voltage range may be related to bias current and $R_i$. For this particular embodiment, for example, this may be described by the following relationship:

$$-i_1 \cdot R_i < v_{in} < i_1 \cdot R_i \quad (9)$$

To evaluate noise and low voltage aspects of this particular embodiment, illustrated in FIG. 2, a simplified noise analysis may be employed. For this embodiment, input referred thermal noise contributed by M1-M14, $R_{in}$ and $R_{out}$ may be described by the following relationship:

$$\overline{V_{n,thermal}^2} \approx 4kT\Delta f \left[\frac{1}{3}\left(\frac{2}{g_{m1}} + R_i\right)^2 \cdot (g_{m5} + g_{m9}) + \frac{4}{3g_{m1}} + \frac{2g_{m3} + g_{m13}}{3} \cdot R_i^2 + R_i + \frac{R_i^2}{R_{out}}\right] \quad (10)$$

The input referred flicker noise from M1-M14 may be described by the following relationship:

$$\overline{V_{n,flicker}^2} \approx \frac{1}{2}\left(\frac{2}{g_{m1}} + R_i\right)^2 \cdot \\ \left(g_{m5}^2 \cdot \overline{V_{nf5}^2} + g_{m9}^2 \cdot \overline{V_{nf9}^2}\right) + \\ 2 \cdot \overline{V_{nf1}^2} + \left(g_{m3}^2 \cdot \overline{V_{nf3}^2} + \frac{1}{2} \cdot g_{m13}^2 \cdot \overline{V_{nf13}^2}\right) \cdot R_i^2 \quad (11)$$

where $\overline{V_{nfi}^2}$ denotes the flicker noise of transistor Mi and is given by $$\overline{v_{nfi}^2} = \frac{K_i}{(W \cdot L)_i f} \cdot \Delta f \quad (12)$$

From relationships (10) and (11), one may infer that noise may be reduced by employing a relatively large $g_{m1}$ and a relatively small $g_m$ for the other transistors. This may be achieved, for example, by choosing appropriate aspect ratios (W/L).

M7 and M8 employ a common gate configuration, as part of the previously described cascade configuration. Transistors M1 and M2 contribute little or negligible thermal and flicker noise. M7 and M8 are, therefore, not included in equations (10) and (11). Thus, aspect ratios of M7 and M8 may be made relatively large to reduce the overdrive voltage and provide more voltage headroom. For M3-M6 and M9-M14, small aspect ratios may assist in terms of low noise considerations. However, a limit exists in terms of how small the aspect ratios to be employed may become. This occurs at least in part from voltage headroom constraints related to low voltage operation.

More specifically, power supply voltage may be described from the following relationship:

$$V_{cc,min} = V_{thn} + V_{dsat3} + V_{dsat7} + V_{dsat5} \quad (13)$$

where $V_{Dsat}$ is the overdrive voltage. According to relationship (13), for a 1-V supply, for example, $V_{dsat3} + V_{dsat7} + V_{dsat5}$ should not exceed $(1-V_{thn})$, although claimed subject matter is not limited in scope in this respect, of course.

Moreover, the noise contribution of M7 and M8 may become non-negligible if M5 and M6 operate near the edge of saturation region where output impedance decreases significantly. Thus, M5 and M6 are given enough margin in $V_{DS}$ to operate safely in the saturation region and have reasonably high output impedance for this particular embodiment. PMOS transistors generally exhibit low flicker noise and, of course, may be employed as input transistors. However, in a targeted CMOS process, the threshold voltage of a PMOS transistor is about 0.2 V higher than that of an NMOS transistor. For this particular embodiment in which low voltage operation is desired, NMOS transistors are therefore chosen as the input transistors in the circuit of FIG. 2, although, again, this is merely one example embodiment and claimed subject matter is not limited to this example.

Relationships (10) and (11) imply that a small $R_i$ may be employed for relatively low noise operation. On the other hand, the input range is directly proportional to $R_i$ for a fixed bias current according to relationship (9). Therefore, tradeoffs may exist among competing factors of noise, input range and power consumption.

Some signals, such as signals employed in medical applications, for example, may include a DC component of several milli-volts in comparison with an AC component in a micro-volt range. Thus, a reasonable portion of the dynamic range may be used to accommodate a DC component if that component is not removed. Likewise, for low voltage operation, voltage headroom is, in general, limited.

Figure 3:
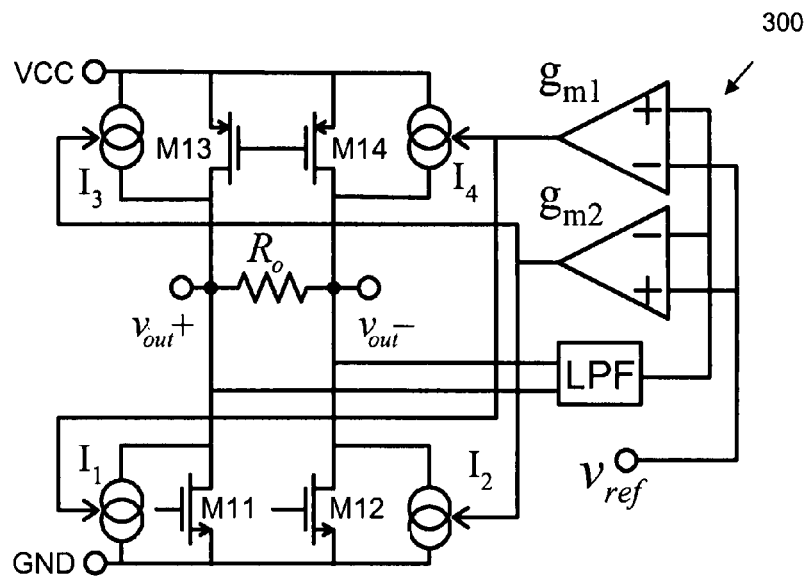
FIG. 3 is a schematic diagram of an embodiment of a DC rejection circuit, such as may be employed in the embodiment of FIG. 2, for example.
Figure 4:
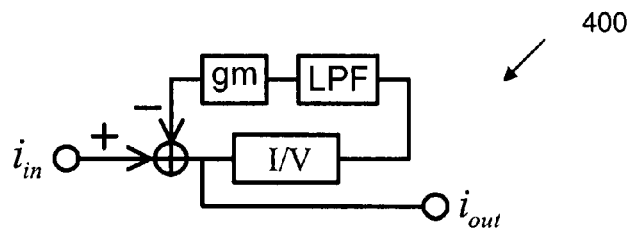
FIG. 4 is a schematic diagram of an embodiment of a system that may employ an embodiment of a DC rejection circuit, such as the embodiment of FIG. 3, for example.
Figure 5:
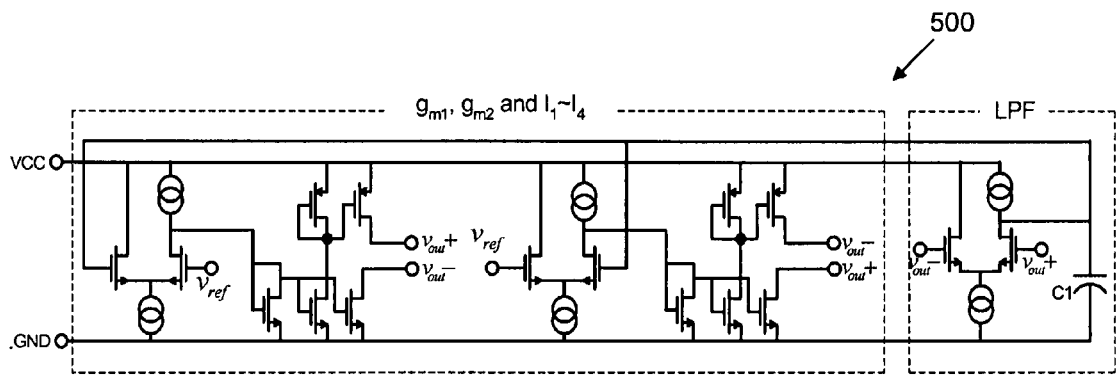
FIG. 5 is a schematic diagram of another embodiment of a DC rejection circuit, such as may be employed in the embodiment of FIG. 2, for example.

Thus, a proposed DC rejection circuit is shown in FIG. 3, together with an output stage of an amplifier, shown here without a common mode feedback (CMFB) circuit. This circuit may comprise a high-pass filter implemented by a frequency selective feedback network, as illustrated in FIG. 4, where $i_{in}$ is $i_{Ro}$ in the absence of a DC rejection circuit. More specifically, for this particular embodiment, $i_{in} = (i_{11} - i_{12})/2$ and $i_{out}$ is $i_{Ro}$ in the presence of a DC rejection circuit. For this embodiment, a cut off frequency of 0.4 Hz is employed, which is implemented here by a 200-nF off-chip capacitor. The amount of input DC level that may be rejected depends at least partially on the dynamic range of current sources $I_1$ to $I_4$. To address the issue of potentially draining too much current, high values of $I_1$ to $I_4$ are set to 4 µA. This translates into a corresponding input DC level of ±11 mV, which is sufficient for the present application. Since here the DC rejection circuit works in the current domain, it does not require much voltage headroom to operate, which is one advantage of this particular embodiment of a DC rejection circuit, although claimed subject matter is not limited in scope in this respect. An example of another implementation of a DC rejection circuit is shown in FIG. 5.

Figure 6:
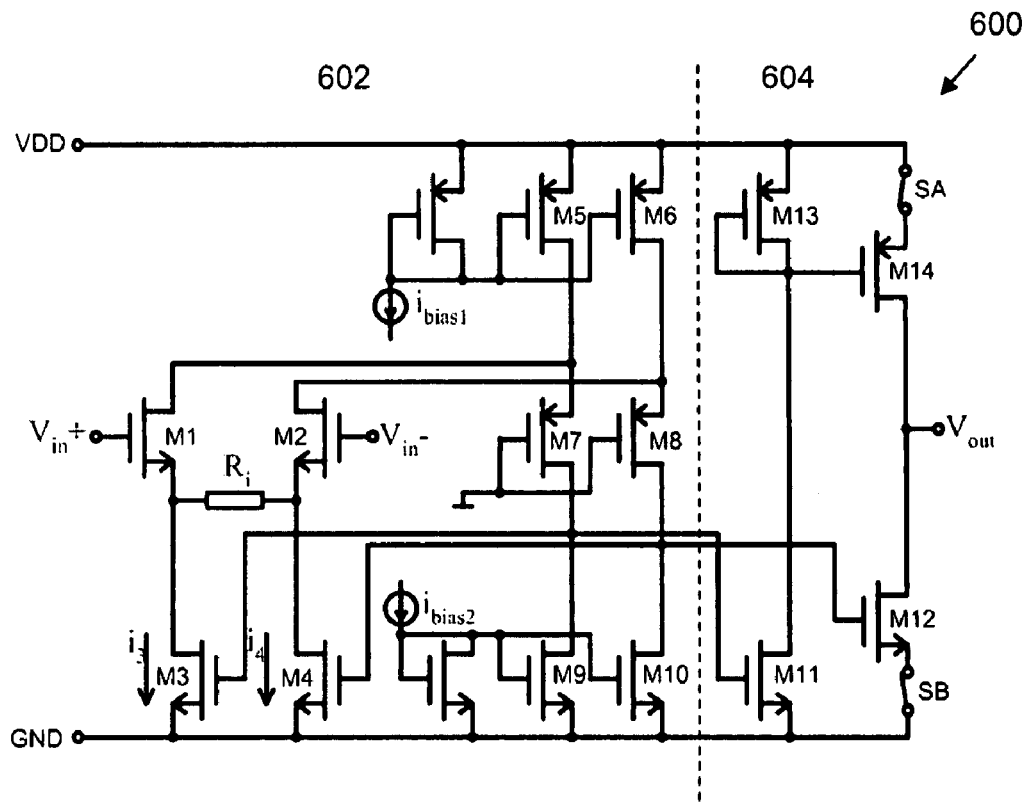
FIG. 6 is a schematic diagram of another embodiment of an amplifier such as in accordance with claimed subject matter.

FIG. 6 shows a schematic drawing of an amplifier 600. Amplifier 600 has an input stage 602 comprising transistors M1-M10 and an output stage 604 comprising transistors M11-M14. M1 to M10 in this embodiment forms a series-shunt feedback loop for controlling respective gate voltages of a pair of transistors M3 and M4 of the input stage. Assuming output impedance of transistors M1-M14 of 600 is sufficiently high, current flowing through M1 and M2 is substantially fixed at $i_{bias1}$-$i_{bias2}$. Input transistors M1 and M2 operate here as a differential voltage follower and the voltage across the resistor $R_i$ is $V_{in}$. M1-M10 and $R_i$ form a feedback loop which adjusts the gate voltages of M3 and M4 so that $$i_4 - i_3 = \frac{2 \cdot V_{in}}{R_i} \quad (14)$$

Equation (14) suggests that M1-M10 and $R_i$ form a $g_m$-cell with its transconductance being $$G_m = \frac{2}{R_i} \quad (15)$$

The output signal of this $g_m$ cell is converted into a single-ended output signal by M1-M14. A comparison of FIGS. 1 and 6 shows that amplifier embodiment 600 replaces the differential-pair $g_m$-cell in FIG. 1 with a $g_m$-cell formed by M1-M10 and $R_i$.

Noise analysis shows that the input referred thermal noise of amplifier 600 is $$\overline{V_{n,in}^2} = 4kT\Delta f \left[ \frac{4}{3 \cdot g_{m1}} + \frac{2}{G_m} + \frac{4}{3} \cdot \left( \frac{1}{g_{m1}} + \frac{1}{G_m} \right)^2 \cdot \right. \quad (16)$$

$$\left. (g_{m5} + g_{m9}) + \frac{4}{3G_m} \left( \frac{g_{m3}}{G_m} + \frac{1}{K^2} \cdot \frac{g_{m11} + g_{m13}}{G_m} \right) \right]$$

where $K = (W/L)_{11}/(W/L)_3$. Since the drain voltages of M9 and M10 are relatively high ($V_{DS9} = V_{GS3}$) and biased at a low current, the transconductance $g_{m9}$ and $g_{m10}$ of M9 and M10 may be made lower than the transconductance of other transistors. Assuming that $g_{m9}$, $g_{m10} \ll g_{m1}$, $g_{m5}$ and $R_i \ll 1/g_{m1}$, relationship (16) becomes $$\overline{V_{n,in}^2} \approx \left[ \frac{16kT}{3g_{m1}} \left( 1 + \frac{g_{m5}}{g_{m1}} \right) \right] \Delta f + \quad (17)$$

$$\frac{16kT}{3G_m} \left[ \frac{g_{m3}}{G_m} + \frac{1}{K^2} \cdot \frac{(g_{m11} + g_{m13})}{G_m} \right] \Delta f$$

Relationship (17) suggests that noise contribution from output transistors M11-M14 is not substantially dependent on the transconductance of the input transistors, such as $g_{m1}$, for example, but is at least partially dependent on $G_m$ instead.

This difference between amplifier 600 and the known differential-pair-based amplifier of FIG. 1 may be desirable in at least some situations. For example, for amplifier 600, a trade-off between noise performance and voltage-headroom is not necessary or present and is, therefore, not employed. This permits a rail-rail output signal for a low supply voltage, for example, without significant signal degradation. Thus, this particular embodiment has the capability to achieve low-voltage, low-power, and low-noise performance, as well as a rail-rail output signal. Of course, claimed subject matter is not limited in scope to this particular embodiment or to these advantages; however, depending on the particular embodiment, such advantages may be present.

It should be noted that according to relationship (16), a noise-voltage headroom trade off exists in input stage 602 of amplifier 600. Transconductance $g_{m5}$ and $g_{m9}$ may therefore be employed to achieve low input-referred noise. However, since voltage swing is low in input stage 602, this trade-off is tolerable.

Figure 10:
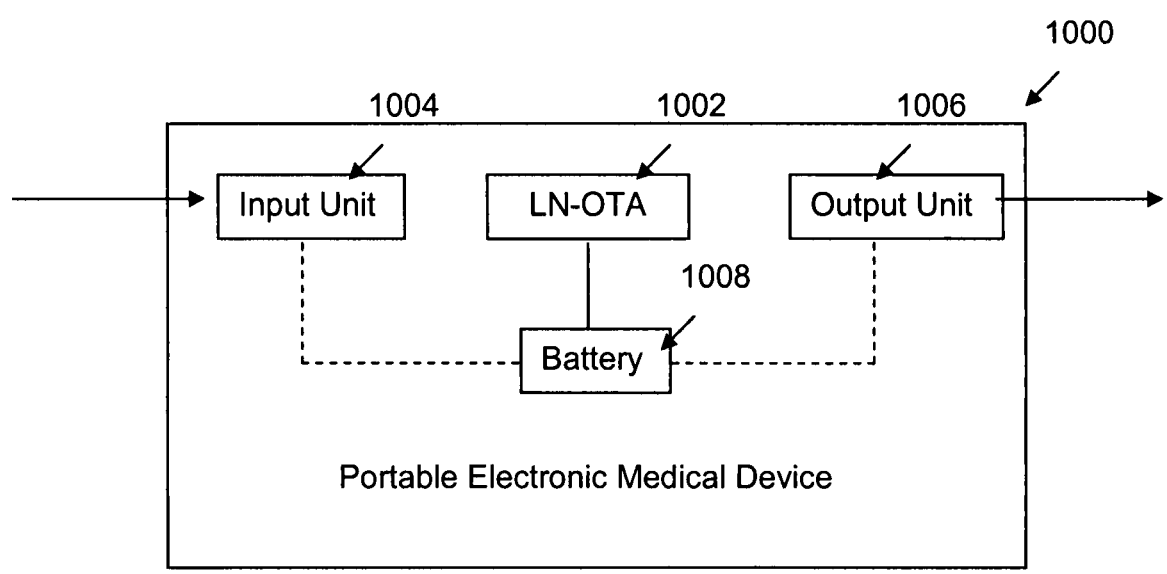
FIG. 10 is a schematic diagram of an embodiment of a system that may employ an embodiment of an amplifier such as in accordance with claimed subject matter.

The amplifier embodiment as described above can be used for a large variety of applications in which low voltage, low power and low noise are desired, including in portable medical devices, such as devices for electrocardiogram (ECG) or electroencephalogram (EEG), although, of course, claimed subject matter is not limited in scope in this respect. For example, FIG. 10 shows a battery operated electronic device 1000 comprising an amplifier 1002. The device has amplifier 1002 coupled to an input unit 1004 for receiving input signals. The device 1000 also has amplifier 1002 coupled to an output unit 1006 for signal processing or other applications. A battery 1008 powers amplifier 1002 and may also power other active components of input unit 1004 and output unit 1006.

Figure 11:
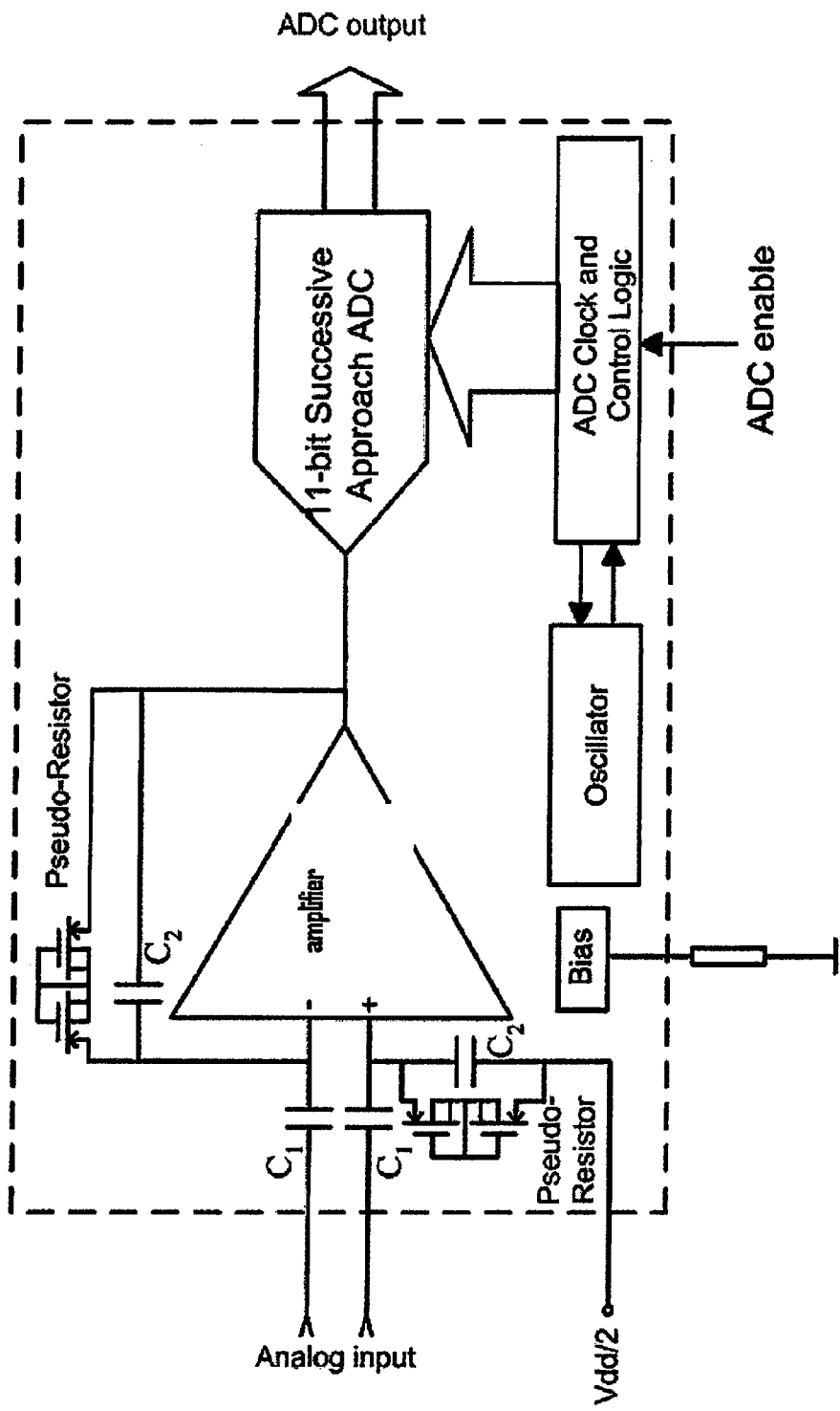
FIG. 11 is a schematic diagram of an embodiment of an integrated circuit chip that may employ an embodiment of an amplifier such as in accordance with claimed subject matter.

In one potential application, patients, for example, may benefit from wearable medical devices that provide real-time monitoring and/or possibly on-site treatment. It would be desirable for such devices to operate using a micro battery that is light-weight and low-volume, for example. Devices under such a constraint may operate, for example, at a low supply voltage, such as 1~1.5V, with ultra low power consumption for long battery lifetime, although, of course, this is merely an example and claimed subject matter is not limited in scope in this respect. In addition, to pick up potentially weak biomedical signals, it may be desirable that a device exhibit low input referred noise. One example embodiment of such a device is illustrated in FIG. 11. The integrated circuit illustrated comprises a 1 V, 2.3 W biomedical signal acquisition IC. Here, a low noise amplifier with DC rejection, such as one of the embodiments previously described, may be employed. Likewise, an 11-bit successive approximation ADC and other auxiliary circuits are included.

This example implementation was fabricated in a 0.35 μm process. Test results show that a resulting amplifier consumes about 330 nA at a supply voltage of approximately 1 V while input referred noise is about 2.7 μVrms (integrated up to about 245 Hz), which gives an NEF of about 3.8. For a fair comparison with the previously described known CMOS amplifier of R. R. Harrison, C. Charles "A Low-Power Low-Noise CMOS Amplifier for Neural Recording Applications," IEEE J. Solid State Circuits, vol. 38, no. 6, pp 958-965, June, 2003, bias consumption is excluded from the NEF calculation. $V_{Dsat}$ of M11-M14 may be kept approximately below 50 mV, which enables rail-rail output swing up to about 850 mVp-p with total harmonic distortion (THD) approximately less than 1%. In other words, the drain saturation voltages of the output transistors of the output stage are chosen for weak conversion operation and for substantially rail-rail output swing. Thus, while an NEF of 4.0 may be achieved by using a known CMOS amplifier and setting an overdrive voltage of the output transistors approximately above 240 mV, this may be less desirable for a low-voltage design.

Figure 12:
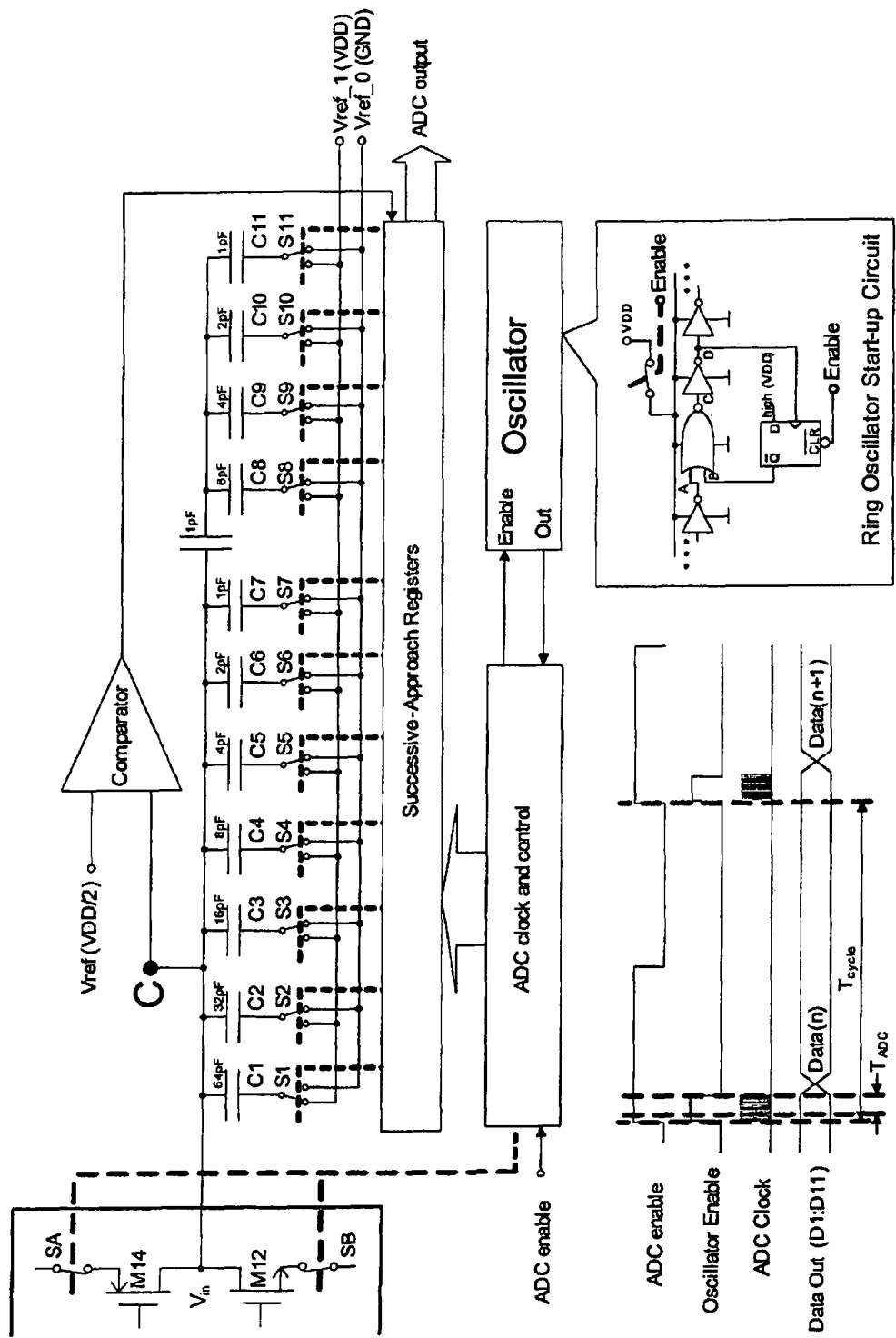
FIG. 12 is a schematic diagram illustrating the embodiment of FIG. 11 in more detail.
Figure 13:
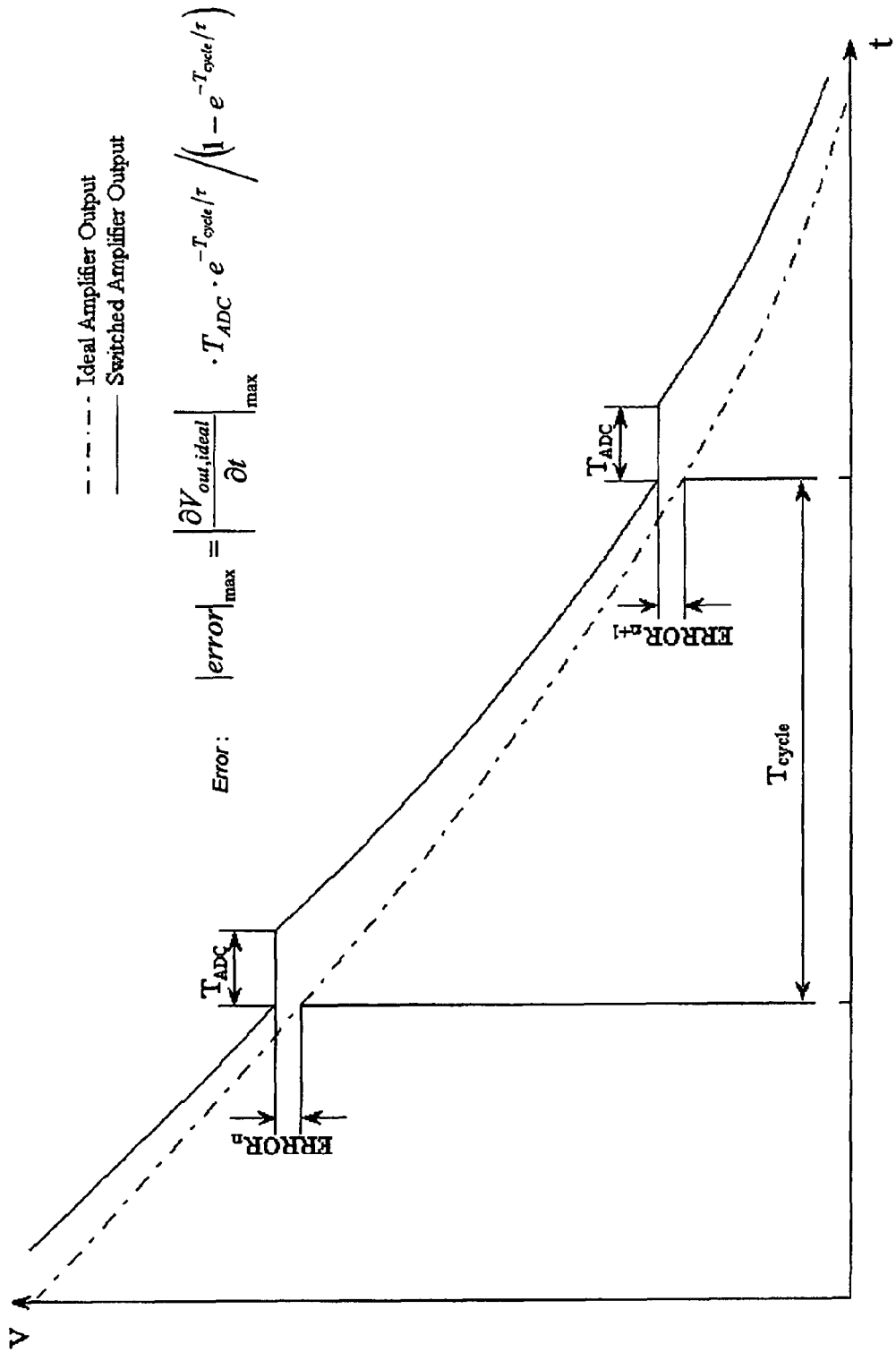
FIG. 13 is a plot illustrating voltage versus time for an ideal amplifier and a non-ideal amplifier.

As illustrated in FIG. 11, a DC rejection circuit may be implemented using pseudo-resistors, as proposed in the aforementioned Harrison and Charles article. To conserve power, for this particular embodiment, the ADC does not have a dedicated S/H circuit. The S/H operation may, instead, be performed through the output stage of the amplifier, which may be considered a pseudo S/H circuit. As shown in FIG. 12, the amplifier is coupled directly to a capacitor array in the successive approximation ADC. During A/D conversion, two switches (SA and SB) in the output stage of the amplifier are turned off and the signal is held on the capacitor array of the ADC. After A/D conversion, SA and SB are turned on. Periodically switching the output stage may, however, introduce error. As illustrated in FIG. 13, $T_{ADC}$ represents the period of switching for the amplifier output stage for A/D conversion and $T_{cycle}$ is the sampling period. Applying a first-order model to this particular embodiment, as illustrated in FIG. 13, if $T_{cycle}$ is sufficiently long and $T_{ADC}$ is sufficiently short, error attributable to switching should be small and nearly, if not completely, negligible. In this particular embodiment, the sampling rate is 1 kS/s, $T_{cycle}$ is 1 ms and $T_{ADC}$ is 2 us, although, of course, these are merely examples and claimed subject matter is not limited in scope in this respect. A possible input-referred error for a typical ECG signal is less than ±0.3 uV, which is below this particular embodiment.

Conventional capacitor-array-based successive approximation ADCs typically employ a supply voltage higher than $V_{thn}+V_{thp}$ to achieve a rail-rail input range. In this particular embodiment, an alternate approach is employed, although claimed subject matter is again not limited in scope to this example embodiment. This particular embodiment achieves a rail-rail input range if a comparator common-mode input range encompasses $V_{DD}/2$. If ADC is inactive, the output signal of the amplifier is provided. In this embodiment, S1 is switched to $V_{DD}$ and S2~S11 are switched to GND. Node C is charged to $V_{in}$. During A/D conversion, the output stage is turned off and the voltage at node C successively approaches $V_{DD}/2$ to perform A/D conversion, as desired. Here, an on-chip clock is generated by an 11-stage ring oscillator. Current-steering logic gates are chosen to reduce switching noise. To conserve power, the oscillator is turned on if the ADC is active, but otherwise is not. A start-up circuit, as shown in FIG. 12, may be employed for a substantially uniform start-up time for a conversion cycle. As an added precaution, the first dozen cycles of the oscillator after start-up may also be discarded. Likewise, in this embodiment, as illustrated, a dynamic comparator that does not consume power if inactive is employed to reduce power consumption.

Figure 7:
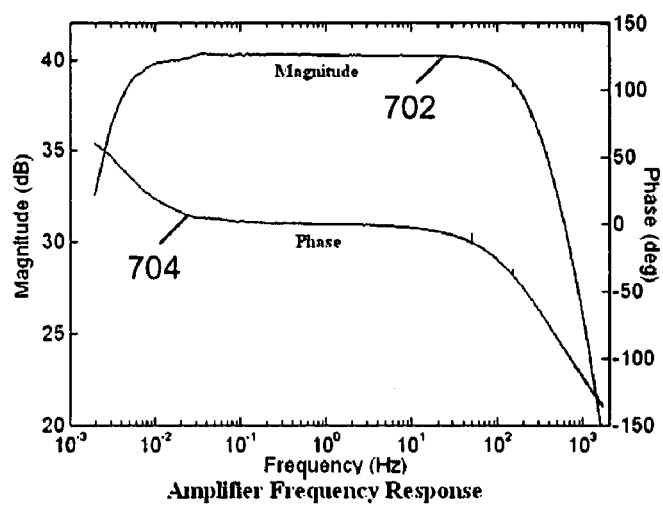
FIG. 7 is a plot of magnitude in decibel (dB) versus frequency in Hertz (Hz) and a plot of phase in degrees (deg) versus frequency (Hz) for an embodiment.

Further results are described with reference to FIGS. 7-9. FIG. 7 shows a plot 702 of magnitude in decibels (dB) versus frequency in Hertz (Hz) and a plot 704 of phase in degrees (deg) versus frequency (Hz). From plot 702, it can be observed that the magnitude increases from about 32 dB to about 40 dB, at which point the frequency increases from about $2\times10^{-3}$ Hz to about $3\times10^{-2}$ Hz. The magnitude remains about constant at a value of about 40 dB for a range of frequency from about $3\times10^{-2}$ Hz to about 50 Hz. The magnitude then decreases from about 40 dB to about 20 dB as the frequency increases from about 50 Hz to about $1.8\times10^3$ Hz.

From plot 704, it may be observed that the phase decreases from about 60 deg to about 10 deg as the frequency increases from about $2\times10^{-3}$ Hz to about $3\times10^{-2}$ Hz. There is a gradual decrease in the phase from about 10 deg to about 0 deg as the frequency increases from about $3\times10^{-2}$ Hz to about 10 Hz. As the frequency increases from about 10 Hz to about 1.8×1 Hz, the phase decreases from about 0 deg to about −130 deg.

Figure 8:
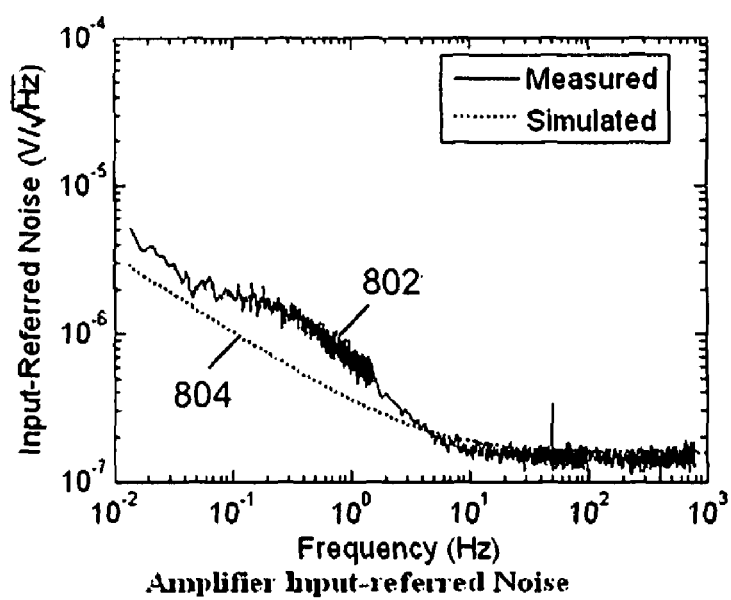
FIG. 8 shows two plots of input-referred noise (V/√Hz) versus frequency (Hz) for an embodiment.

FIG. 8 shows plots 802 and 804 of input-referred noise (V/√Hz) versus frequency (Hz). Plot 802 is obtained from measured input-referred noise while plot 804 is obtained from simulated input-referred noise. For the range of frequency of about 0.15 Hz to about 20 Hz, there is a deviation between the input-referred noise of plots 802 and 804. For the range of frequency of about 20 Hz to about 800 Hz, the input-referred noise of plots 802 and 804 correspond with one another.

Figure 9:
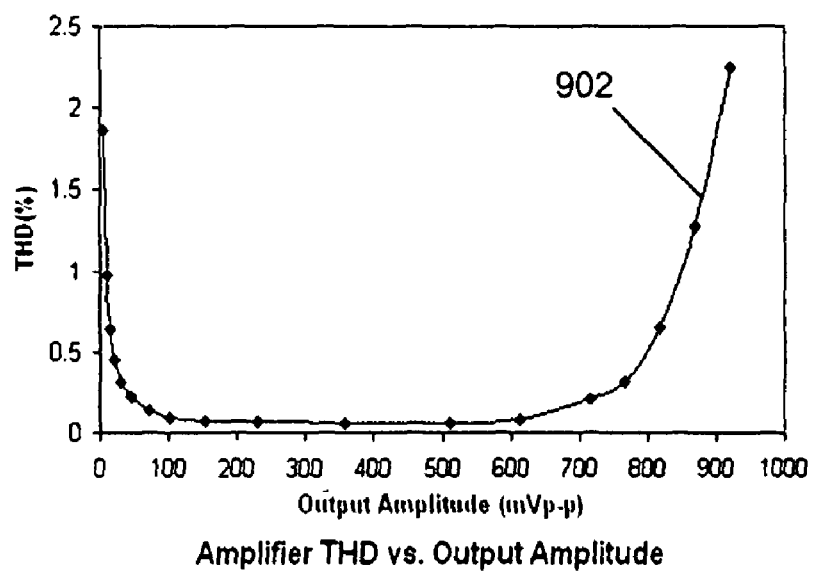
FIG. 9 is a plot of total harmonic distortion (THD) in percentage versus output amplitude in $mV_{p-p}$ for an embodiment.

FIG. 9 shows a plot 902 of total harmonic distortion (THD) in percentage versus output amplitude in $mV_{p-p}$. THD decreases from about 1.8% to about 0.1% as the output signal amplitude increases from about 0 to about 150 $mV_{p-p}$. THD remains at roughly a constant value of about 0.1% for a range of output signal amplitude of about 150 $mV_{p-p}$ to 580 $mV_{p-p}$. THD increases from about 0.1% to about 2.25% as output signal amplitude increases from about 580 $mV_{p-p}$ to about 920 $mV_{p-p}$.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of amplifying a differential voltage signal comprising:
    applying the differential voltage signal to an input resistance;
    producing a transconductance gain proportional to the input resistance; and
    removing a DC voltage signal component of the differential voltage signal.

2. The method of claim 1, further comprising:
    producing an output voltage signal that is substantially rail-to-rail at a relatively low voltage.

3. The method of claim 2, wherein the relatively low voltage comprises about one volt.

4. An apparatus comprising:
    an input stage comprising a series-shunt feedback loop for controlling respective gate voltages of a first pair of transistors of the input stage; and
    an output stage coupled to the first pair of transistors of the input stage such that respective gates of a first pair of transistors of the output stage are coupled to the respective gates of the first pair of transistors of the input stage.

5. The apparatus of claim 4, wherein the input stage comprises a second pair of transistors, wherein gates of the second pair of transistors of the input stage are coupled to receive a differential voltage input, and wherein sources of the second pair of transistors of the input stage are coupled to respective drains of the first pair of transistors of the input stage.

6. The apparatus of claim 5, wherein the feedback loop comprises a resistor coupled between the sources of the second pair of transistors of the input stage.

7. The apparatus of claim 6, wherein the feedback loop further comprises a third pair of transistors in a cascade configuration with the second pair of transistors of the input stage.

8. The apparatus of claim 4, wherein the apparatus is a battery operated electronic device.

9. The apparatus of claim 4, wherein the apparatus is incorporated into an integrated circuit chip.

10. The apparatus of claim 4, wherein the apparatus is a medical device.

11. The apparatus of claim 10, wherein the medical device is an electroencephalogram or an electrocardiogram.

12. The apparatus of claim 4, wherein the apparatus is a low noise operational transconductance amplifier (LN-OTA).

13. The apparatus of claim 12, further comprising:
    an input unit configured to receive signals;
    an output unit configured to output signals; and
    a battery configured to power the LN-OTA.

14. The apparatus of claim 4, wherein the output stage comprises a second pair of transistors forming a common-mode load for the first pair of transistors of the output stage.

15. The apparatus of claim 14, further comprising a common-mode feedback circuit coupled to gates of the second pair of transistors of the output stage.

16. The apparatus of claim 15, further comprising a resistor coupled between the drains of the second pair of transistors of the output stage, wherein the common-mode feedback circuit is configured to sense a voltage at the resistor.

17. The apparatus of claim 4, further comprising a DC rejection circuit coupled to the output stage.

* * * * *